(12) United States Patent
Chen et al.

(10) Patent No.: US 7,884,028 B2
(45) Date of Patent: Feb. 8, 2011

(54) METHOD OF REMOVING MATERIAL LAYER AND REMNANT METAL

(75) Inventors: Yi-Wei Chen, Tai-Chung Hsien (TW); Chun-Chieh Chang, Tainan County (TW); Tzung-Yu Hung, Tainan Hsien (TW); Yu-Lan Chang, Kao-Hsiung (TW); Chao-Ching Hsieh, Tai-Nan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 868 days.

(21) Appl. No.: 11/733,762

(22) Filed: Apr. 10, 2007

(65) Prior Publication Data

US 2008/0254640 A1    Oct. 16, 2008

(51) Int. Cl.
*H01L 21/302* (2006.01)
(52) U.S. Cl. .................. 438/745; 438/748; 438/753; 438/756; 216/36; 216/67; 216/91; 216/92; 156/345.1
(58) Field of Classification Search ............... 216/37, 216/67, 91, 92; 438/745, 748, 753, 756; 156/345
See application file for complete search history.

(56) References Cited

U.S. PATENT DOCUMENTS

| 5,290,384 A * | 3/1994 | Ketelhohn et al. ...... 156/345.17 |
| 6,395,646 B1 * | 5/2002 | Liu ............................ 438/747 |
| 6,550,990 B2 * | 4/2003 | Sakurai et al. ............... 396/604 |
| 7,390,754 B2 * | 6/2008 | Chang et al. ................. 438/745 |
| 7,544,621 B2 * | 6/2009 | Chen et al. ................... 438/697 |

* cited by examiner

*Primary Examiner*—Lan Vinh
*Assistant Examiner*—Maki A Angadi
(74) *Attorney, Agent, or Firm*—Winston Hsu; Scott Margo (57) ABSTRACT

A method of removing material layer is disclosed. First, a semiconductor substrate is fixed on a rotating platform, where a remnant material layer is included on the surface of the semiconductor substrate. Afterward, an etching process is carried out. In the etching process, the rotating platform is rotated, and an etching solution is sprayed from a center region and a side region of the rotating platform toward the semiconductor substrate until the material layer is removed. Since the semiconductor substrate is etched by the etching solution sprayed from both the center region and the side region of the rotating platform, the etching uniformity of the semiconductor substrate is improved.

20 Claims, 11 Drawing Sheets

| Position | Pre | Post | Delta |
|---|---|---|---|
| Mean (A) | 2948.81 | 876.62 | 2072.20 |
| Max (A) | 3243.81 | 1451.35 | 2565.40 |
| Min (A) | 2251.07 | 389.78 | 1723.08 |
| Std (A) | 304.45 | 257.51 | 165.90 |
| Std (%) | 10.32 | 29.37 | 8.01 |
| WIW (%) | | | 19.05 |
| WTW (%) | | | |

Fig. 10

| Group | First group | | | Second group | | | Third group | | | Fourth group | | |
|---|---|---|---|---|---|---|---|---|---|---|---|---|
| Position | S01 | S13 | S25 | S01 | S13 | S25 | S01 | S13 | S25 | S01 | S13 | S25 |
| Mean (Å) | 644.79 | 562.55 | 491.05 | 325.61 | 349.70 | 318.43 | 307.23 | 321.38 | 311.01 | 284.37 | 337.26 | 311.34 |
| Max (Å) | 1874.37 | 1692.33 | 1519.11 | 540.96 | 632.97 | 590.55 | 592.50 | 632.26 | 653.48 | 578.99 | 713.20 | 665.01 |
| Min (Å) | 267.88 | 201.21 | 194.27 | 136.33 | 149.37 | 137.01 | 120.72 | 141.25 | 106.75 | 102.96 | 109.93 | 105.39 |
| Std (Å) | 372.18 | 345.25 | 294.33 | 109.92 | 131.37 | 119.25 | 128.66 | 135.19 | 140.70 | 136.61 | 163.69 | 157.31 |
| Std (%) | 57.72 | 61.37 | 59.94 | 33.76 | 37.57 | 37.45 | 41.88 | 42.07 | 45.24 | 48.04 | 48.54 | 50.53 |
| WIW (%) | 10.69 | 10.23 | 7.04 | 1.87 | 1.38 | 1.43 | 1.42 | 1.37 | 1.11 | 1.62 | 1.70 | 1.90 |
| WTW (%) | 9.32 | | | 1.56 | | | 1.30 | | | 1.74 | | |

Fig. 11

METHOD OF REMOVING MATERIAL LAYER AND REMNANT METAL

BACKGROUND OF THE INVENTION

1. Field of the Invention

The present invention relates to a method of removing a material layer, and more particularly, to a method that removes a material layer by performing a wet etching process.

2. Description of the Prior Art

Transistors are important electrical components utilized in the manufacture of integrated circuits. As semiconductors become smaller and smaller, the manufacture of transistors has undergone great improvement in order to produce transistors of small size and high quality.

In current transistor manufacturing processes, silicide is widely used in the fabrication of metal-oxide-semiconductor (MOS) transistors on a wafer. For example, the silicide is often formed on the surface of a gate electrode to provide a good ohmic contact at the interface between the gate electrode and a subsequently formed metal layer. Because the materials of the contact plugs are conductive metal, such as tungsten (W), the polycrystalline silicon or monocrystalline silicon of the gate structure and the source/drain regions have a bad electrical conduction with the contact plugs. Therefore, the silicide is formed on the gate structure and the source/drain regions to improve the ohmic contact between the gate structure, the source/drain regions and the conduct plugs, and to enable the sheet resistances of the source/drain regions to decrease at the same time. Among silicide constituents, nickel silicon is considered important to the development of manufacturing processes in the 65 nm MOS technology because of the characteristics including low electrical resistance, low silicon consumption, good resistance behavior in narrow lines, and low processing temperature.

However, since the nickel silicide has low thermal stability, it is possible that nickel may penetrate through the interface between metal and silicon down to the gate electrode to cause spiking effect, or the nickel may laterally diffuse to the channel region to cause nickel-piping effect. In addition, an agglomerating of the nickel silicide might occur. The agglomeration of the silicide increases the contact resistance of the contact plug so that junction leakage occurs. To prevent these defects, a low concentration stable metal is added into the metal layer, which is utilized to form the silicide. For example, 3-8 weight percent (wt %) of platinum (Pt) is added in the nickel metal layer, which is utilized to form the silicide. Because platinum has a stable chemical property, platinum improves the thermal stability of nickel silicon. So, the nickel silicon will not agglomerate at a higher temperature after platinum is added.

Figure 1:
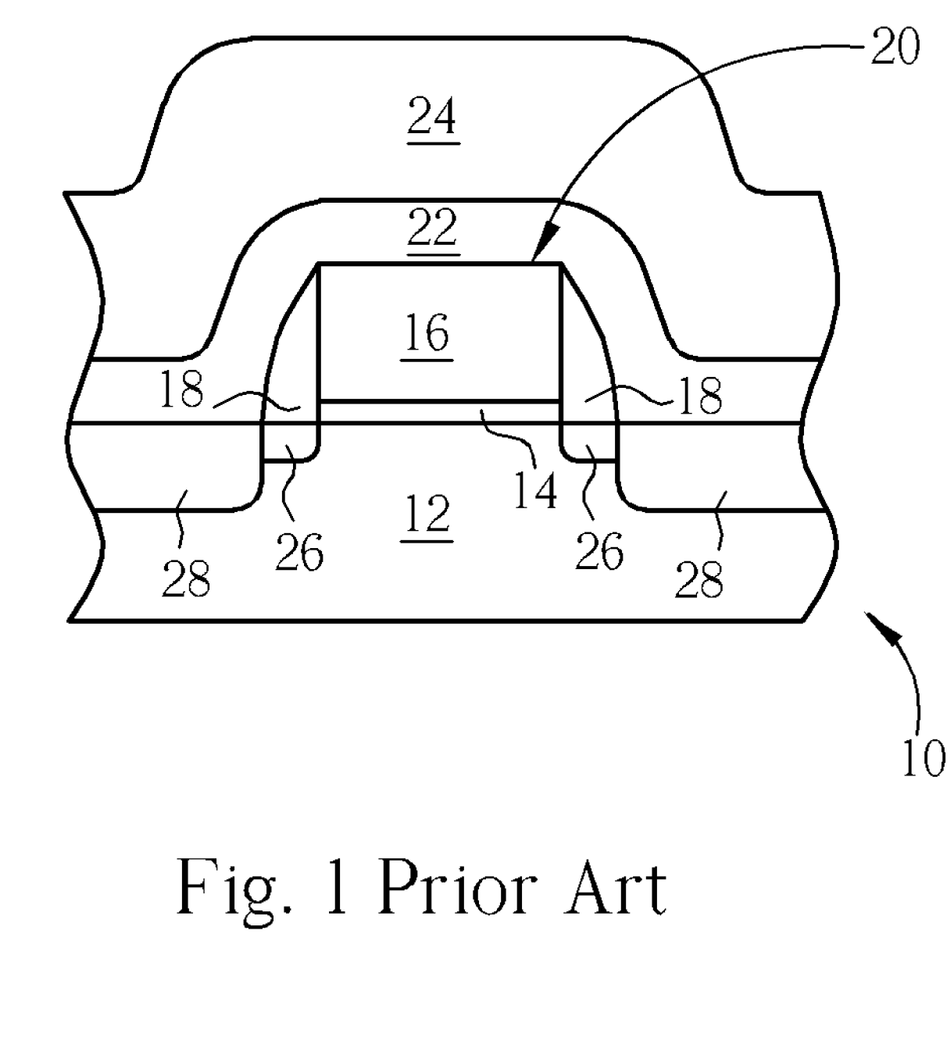
FIGS. 1-4 are schematic diagrams illustrating a method of manufacturing the silicide by utilizing a salicide process in the prior art.

Please refer to FIGS. 1-4. FIGS. 1-4 are schematic diagrams illustrating a method of manufacturing the silicide by utilizing a self-aligned silicidation (salicide) process in the prior art. As shown in FIG. 1, a semiconductor wafer 10 having a semiconductor substrate 12 is prepared. A gate structure 20 is first formed on the semiconductor substrate 12, and the gate structure 20 includes a gate insulating layer 14 and a gate conductive layer 16. Subsequently, an ion implantation is performed, and source/drain extensions 26 (also called lightly doped drains, LDD) are formed in the semiconductor substrate 12 of the two opposite sides of the gate structure 20. Next, a spacer 18 is formed around the gate structure 20. The gate structure 20 and the spacer 18 are utilized as implanting masks and an ion implantation is processed to form the source/drain regions 28 in the semiconductor substrate 12.

Thereafter, a thin film deposition process is performed so that a metal layer 22 is uniformly formed on the semiconductor substrate 12 and the gate 20. The metal layer 22 includes 3-8 wt % of platinum and 92-97 wt % of nickel. Afterward, a TiN layer 24 is sputtered on the metal layer 22.

Figure 2:
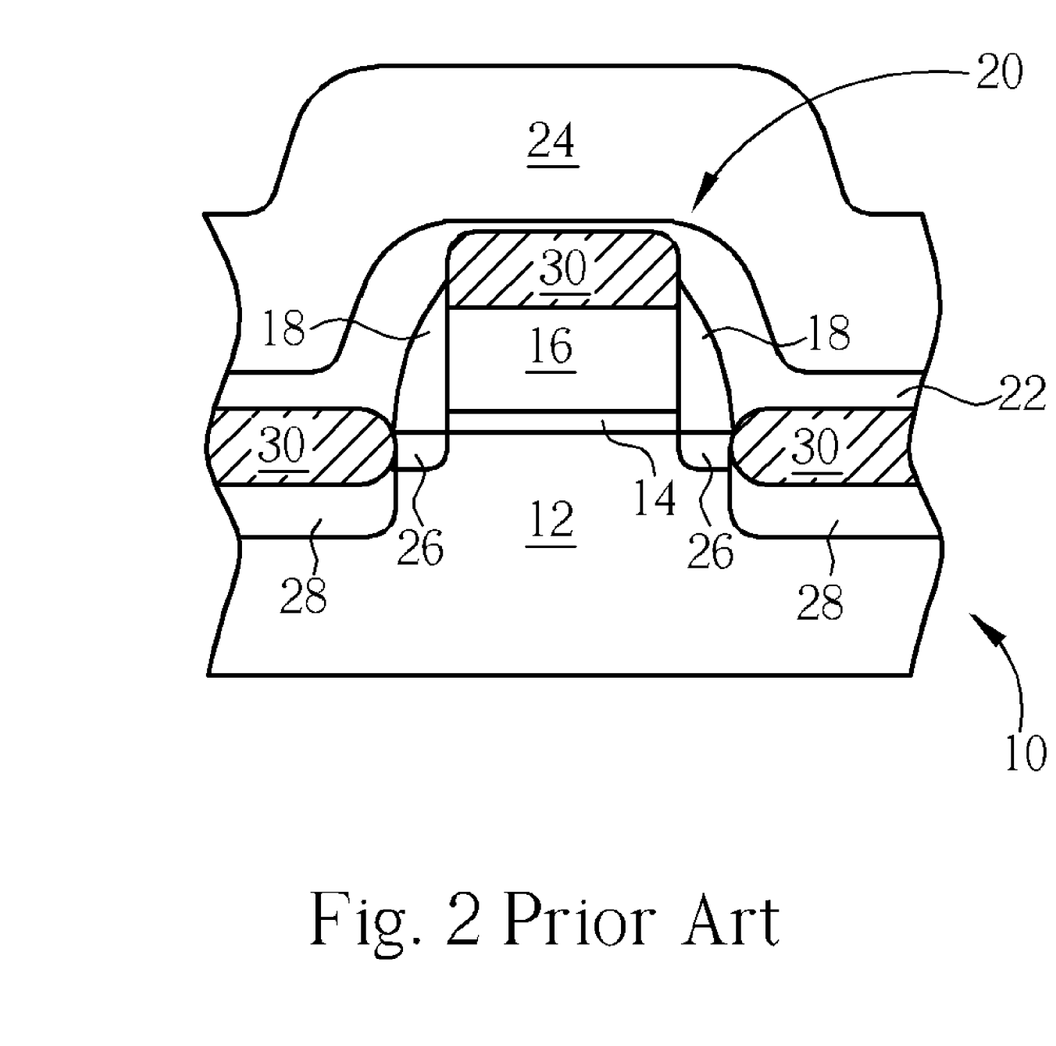

As shown in FIG. 2, a first rapid thermal process (RTP) is performed so that partial metal layer 22 reacts with the silicon in the gate conductive layer 16 positioned under the metal layer 22 and in the source/drain regions 28 to form a transitional silicide 30, such as $Ni_2Si$.

Figure 3:
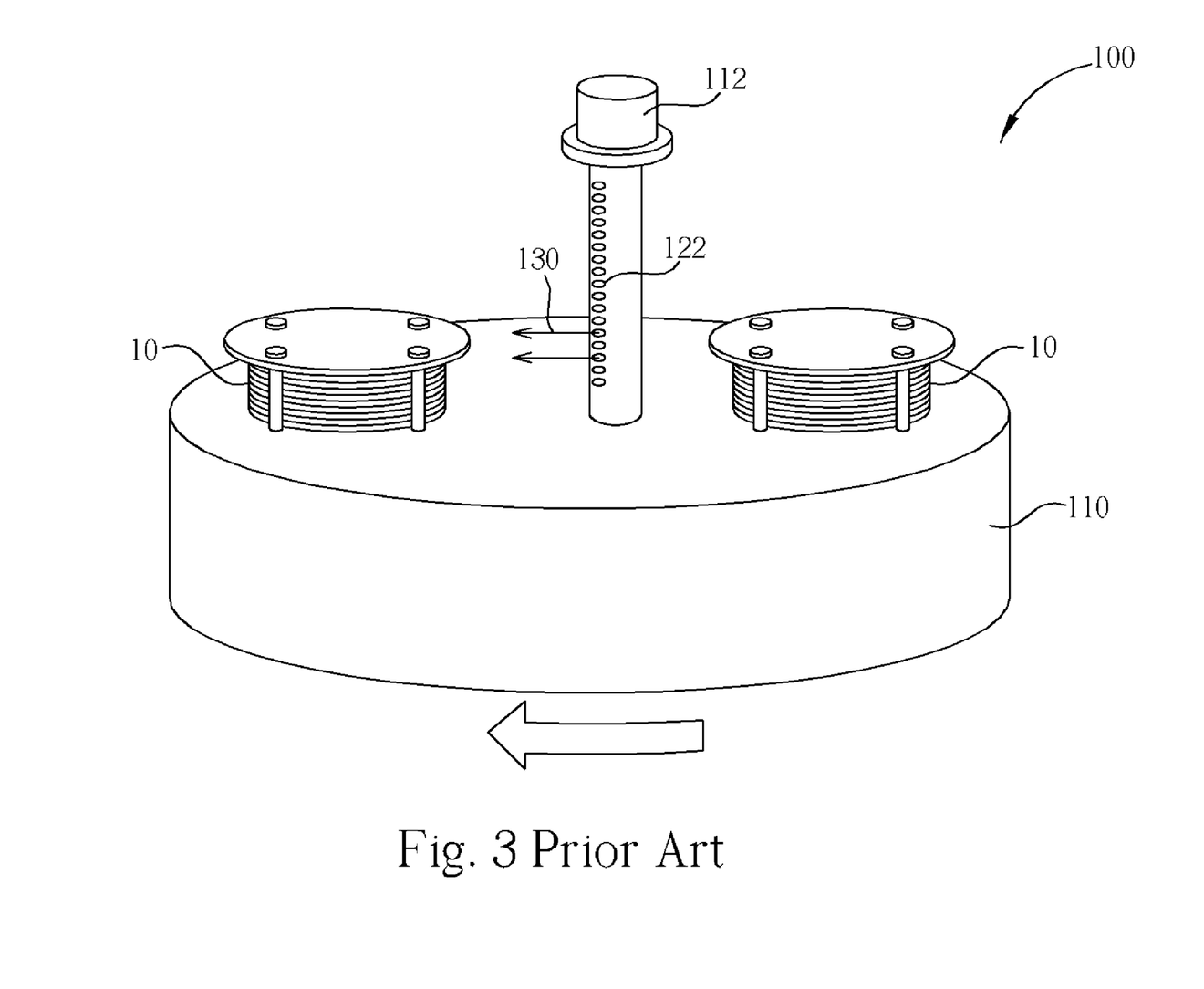

Next, as shown in FIG. 3, a sulfuric acid-hydrogen peroxide mixture (SPM) etching process is performed in an etching equipment 100 so that the TiN layer 24 and the un-reacted nickel in the metal layer 22 are removed. Generally speaking, the etching equipment 100 includes a rotating platform 110, and the semiconductor wafer 10 is fixed on the rotating platform 110. A center pipe 112 positioned on the center region of the rotating platform 110 is included in the etching equipment 100. The center pipe 112 has a plurality of nozzles 122, and the etching solution 130 of the SPM etching process is sprayed from the nozzles 122.

Figure 4:
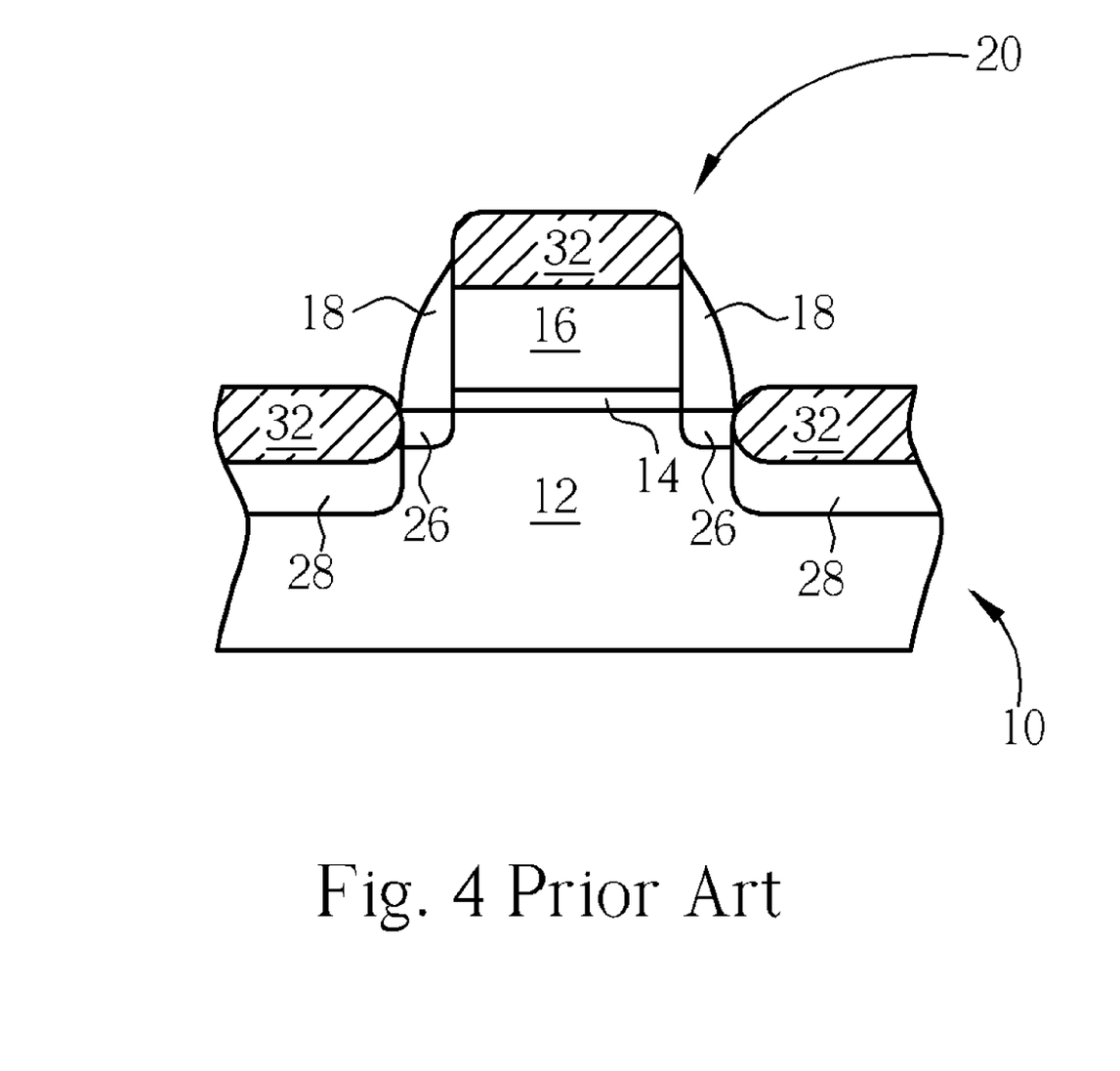

Furthermore, as shown in FIG. 4, a hydrochloric acid hydrogen peroxide mixture (HPM) etching process can be performed in the etching equipment 100. The HPM reacts with un-reacted platinum positioned above the transitional silicide 30 to generate the soluble complex ions. Thus, the un-reacted platinum is stripped. The second RTP is next performed so as to turn the transitional silicide 30 into a silicide 32, which has a lower resistance, such as NiSi.

Although platinum is a noble metal element with stable chemistry properties, and is helpful to improve the thermal stability of nickel silicide, platinum also has the property of being difficult to etch. As a result, platinum remains after removing the un-reacted metal layer. In order to strip the platinum residue effectively, it requires an extremely long etching time. Accordingly, it not only wastes money, but also damages the transitional silicide. The above-mentioned etching solutions include hydrogen peroxide, hydrochloric acid, and chlorine ($Cl_2$). These materials damage the transitional silicide 30. Parts of the transitional silicide are even stripped by these etching solutions. In order to shorten the etching time, an HPM solution having high concentration and high temperature should be used in the etching process. However, it results in an awful etching uniformity of the semiconductor wafer 10, and the product yield is decreased considerably.

SUMMARY OF THE INVENTION

The present invention provides a method of removing a material layer positioned on a semiconductor substrate by performing a wet etching process. The semiconductor substrate is etched by the etching solution sprayed from both the center region and the side region of the rotating platform, so the etching uniformity of the semiconductor substrate is improved.

According to one embodiment of the present invention, a method of removing material layer is disclosed. First, a semiconductor substrate is fixed on a rotating platform, where a remnant material layer is included on the surface of the semiconductor substrate. Afterward, an etching process is carried out. In the etching process, the rotating platform is rotated, and an etching solution is sprayed from a center region and a side region of the rotating platform toward the semiconductor substrate until the material layer is removed.

According to another embodiment of the present invention, a method of removing remnant metal is disclosed. First, a semiconductor substrate fixed on a rotating platform is provided. The semiconductor substrate includes a metal silicide and a remnant metal. Subsequently, an etching process is performed. The etching process rotates the rotating platform, and sprays an etching solution from a center region and a side region of the rotating platform toward the semiconductor substrate until the remnant metal is removed and the metal silicide remains.

Furthermore, according to one embodiment of the present invention, a rotating mode of the rotating platform includes a clockwise spin and a counterclockwise spin in the said etching process. In contrast with the etching process utilizing a single-direction rotating mode, the present invention can increase the etched wafer uniformity because of the two-direction rotating mode that includes the clockwise spin and the counterclockwise spin.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
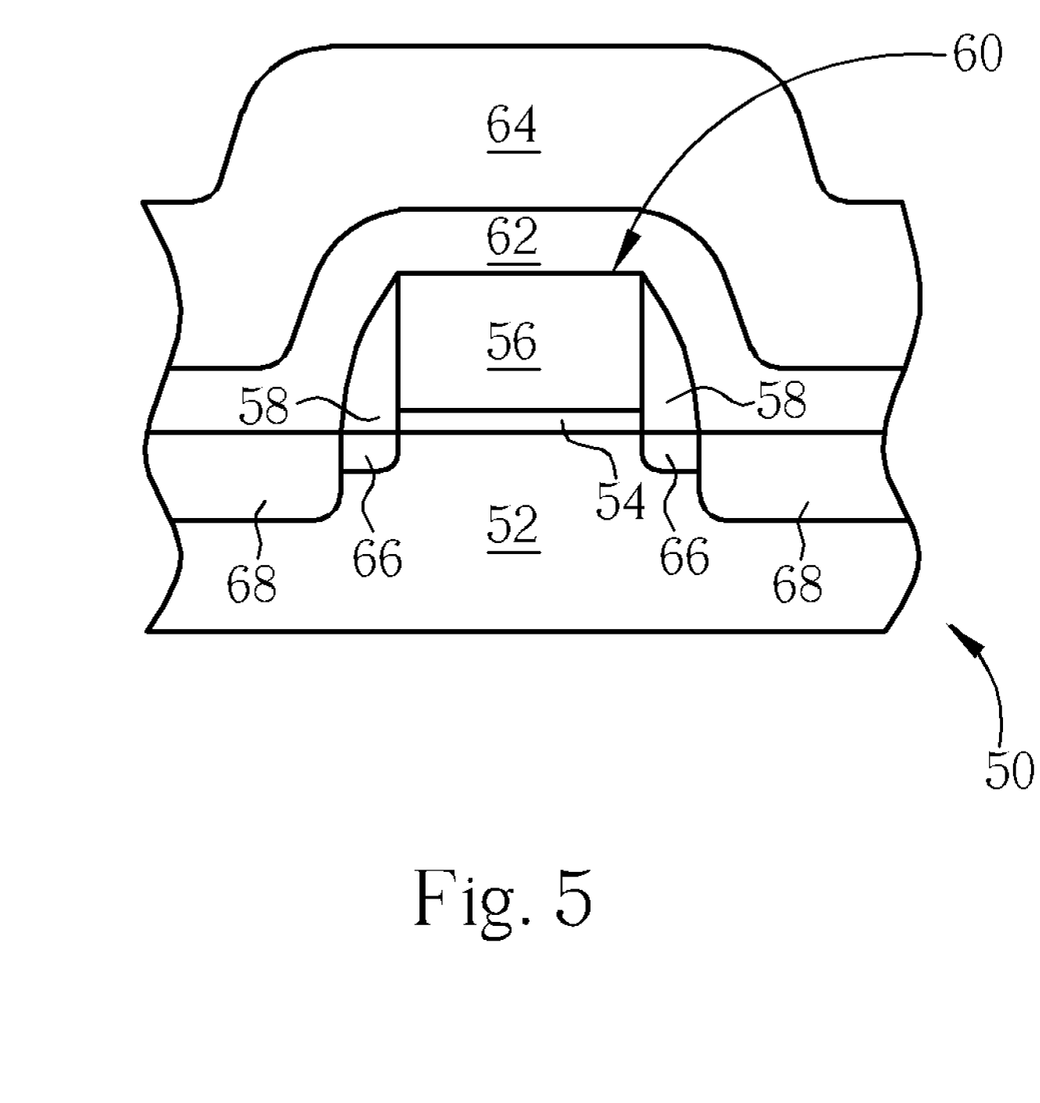
FIGS. 5-8 are schematic diagrams illustrating a method of removing a remnant metal positioned on a silicide according to a first preferred embodiment of the present invention.

Please refer to FIGS. 5-8. FIGS. 5-8 are schematic diagrams illustrating a method of removing a remnant metal positioned on a silicide according to a first preferred embodiment of the present invention, wherein the same numerals designate similar or the same elements. The drawings are not drawn to scale and serve only for illustration purposes. As shown in FIG. 5, a semiconductor wafer 50 having a semiconductor substrate 52 is prepared first. In this embodiment, the semiconductor substrate 52 can be a substrate, such as a silicon substrate or a silicon-on-insulator (SOI) substrate. A gate structure 60 is included on the surface of the semiconductor substrate 52. The gate structure 60 includes a gate insulating layer 54 and a gate conductive layer 56, and a spacer 58 is included around the gate structure 60. The gate insulating layer 54 can be made by a nitric oxide layer, a nitride layer, an oxide layer or another dielectric layer. The gate conductive layer 56 can be made from conductive stacks, such as doped polycrystalline silicon or a metal layer. Furthermore, source/drain extensions 66 (also called LDD) and source/drain regions 68 are included in the semiconductor substrate 52 of the two opposite sides of the gate structure 60.

Subsequently, a film deposition process, such as sputter process, is performed so that a metal layer 62 is uniformly formed on the semiconductor substrate 52 and the gate structure 60. The metal layer 62 may include at least two metal materials. The main metal is also the main composition of the following-formed silicide. The other metal material is a metal having stable chemical properties, where this metal can increase the thermal stability of the following-formed silicide. In this embodiment, the main metal of the metal layer 62 is nickel, and the metal having stable chemical properties is platinum. Thereafter, a TiN layer 64 is sputtered on the metal layer 62. Of course, in other embodiments, the main metal not only can be formed from nickel, but also from other metals, such as cobalt (Co) or titanium (Ti). Any metals, such as palladium (Pd), manganese (Mn), tantalum (Ta), titanium (Ti), ruthenium (Ru) or their mixture, having stable chemical properties can be used for increasing the thermal stability.

Figure 6:
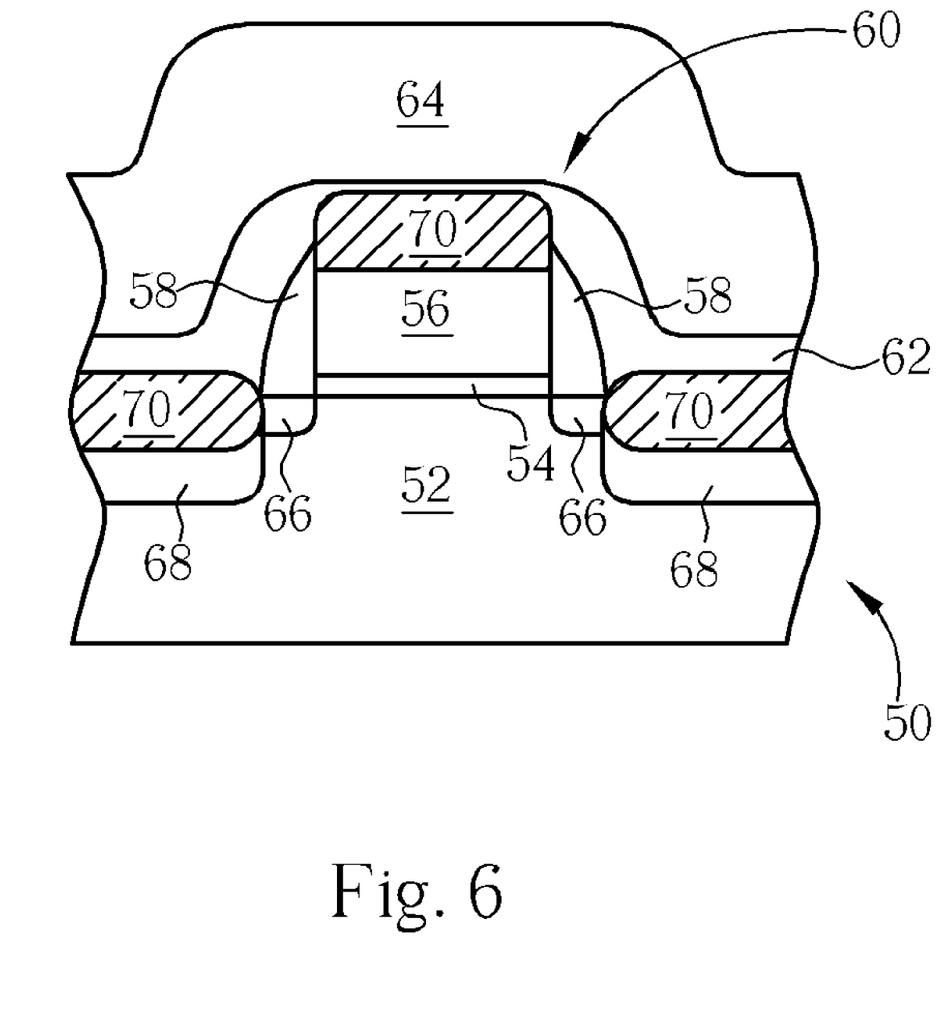

Next, as shown in FIG. 6, a first RTP is performed so that part of the metal layer 62 can react with the gate conductive layer 56 and the source/drain regions 68 located under the metal layer 62 to form the transitional silicide 70, which is $Ni_2Si$ in this embodiment. At the same time, the TiN layer 64, the un-reacted nickel and the un-reacted platinum still remain on the transitional silicide 70.

Figure 7:
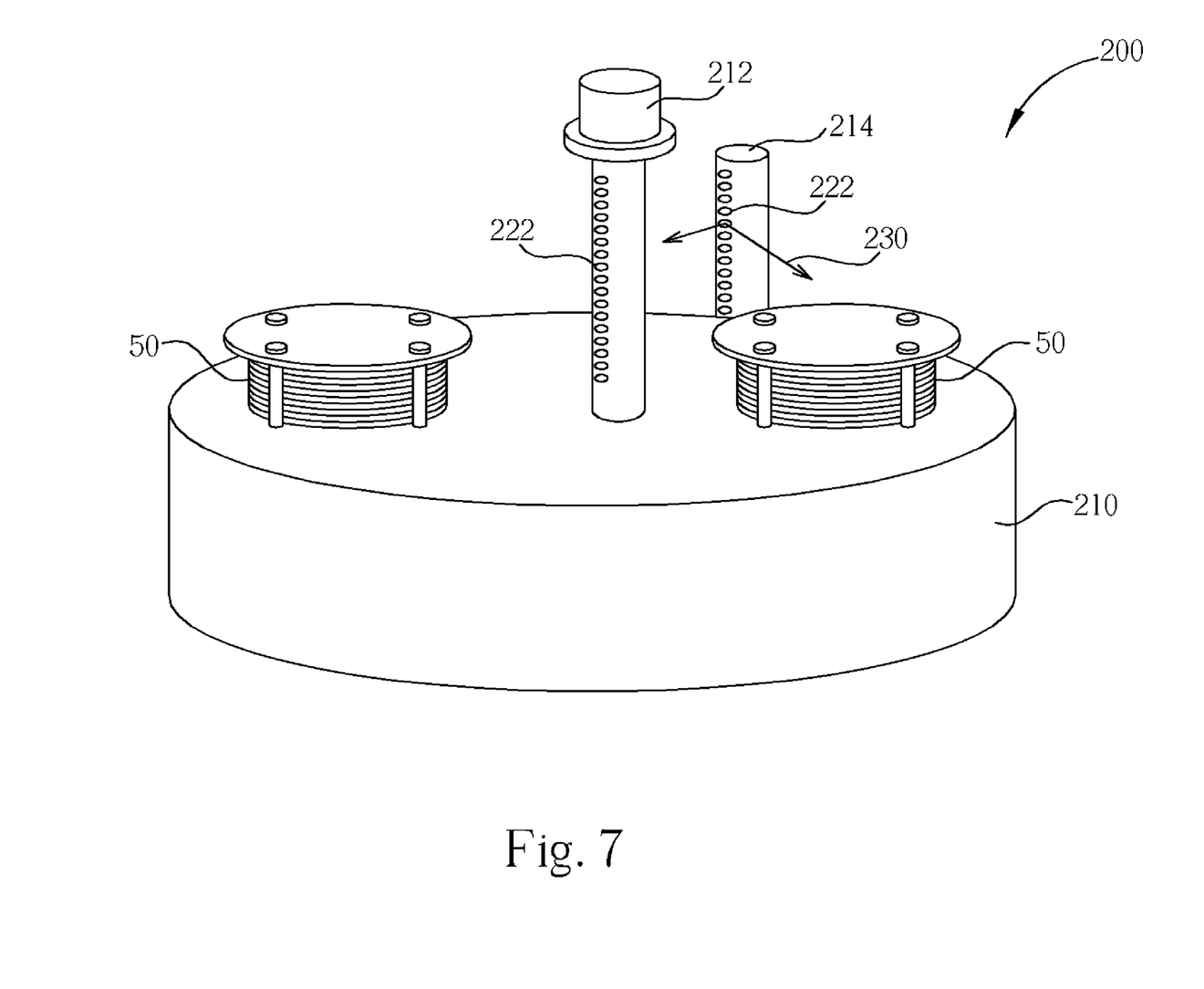

In order to remove the TiN layer 64 and the un-reacted metal layer 62, an SPM etching process is performed in an etching equipment 200 as shown in FIG. 7. The sulfuric acid and the hydrogen peroxide of SPM etching solution react with the TiN layer 64 and the un-reacted nickel so as to remove the TiN layer 64 and the metal layer 62. In this embodiment, the etching equipment 200 includes a rotating platform 210, and the semiconductor wafer 50 is fixed on the rotating platform 210. A center pipe 212 positioned on the center region of the rotating platform 210 and at least a side pipe 214 positioned on the side region of the rotating platform 210 are included in the etching equipment 200. The center pipe 212 and the side pipe 214 have a plurality of nozzles 222 positioned around the center pipe 212 and the side pipe 214 respectively, and the etching solution 230 of the SPM etching process is sprayed from the nozzles 222. Referring to each of the nozzles 222, the etching solution 230 is sprayed along a horizontal direction, and the spraying range is about 120 degrees (120°), forming a fan-shaped liquid film. As known by those skilled in this art, the etching equipment 200 includes a transferring pipe for the etching solution 230, and can be electrically connected to a power-supporting device. The detail structures of the etching equipment 200 are not shown totally in the figures.

In this embodiment, the SPM etching process includes a first spraying period and a second spraying period. The SPM etching solution 230 is sprayed from the side pipe 214 in the first spraying period, and the etching solution 230 is sprayed from the center pipe 212 of the rotating platform 210 in the second spraying period. An operating time percentage of the first spraying period and an operating time percentage of the second spraying period are 50% and 50% respectively. In the meantime, the rotating mode of the rotating platform can be divided into four rotating periods. In the four rotating periods, the rotating platform 210 is rotated along a clockwise direction, a counterclockwise direction, the clockwise direction, and the counterclockwise direction in turn. The SPM etching process takes about 1 minute until the metal layer 62 is stripped and the transitional silicide 70 remains, and each rotating period takes about 25% of the total etching time.

Figure 8:
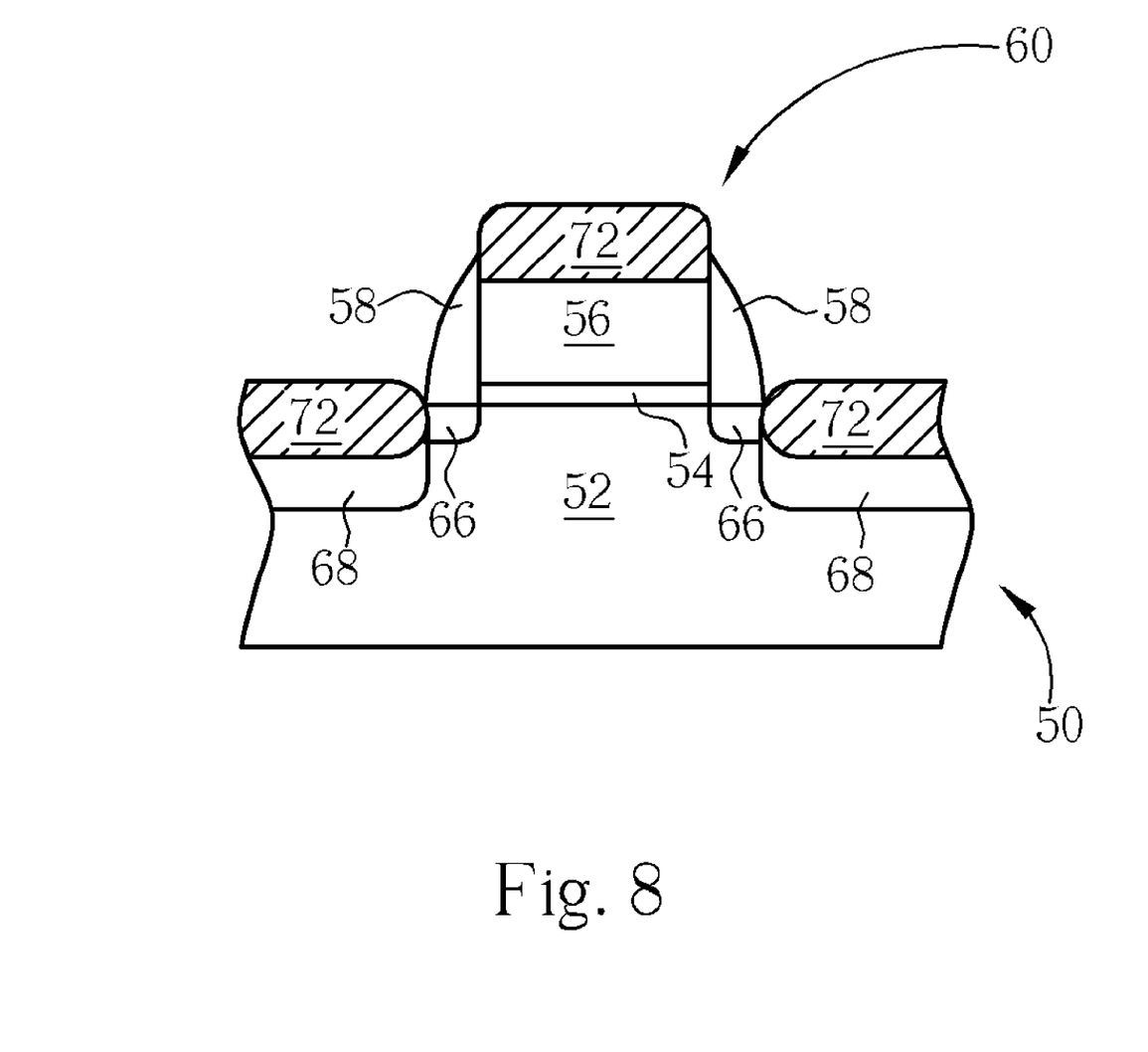

As shown in FIG. 8, thereafter, an ammonium hydrogen peroxide mixture (APM) etching process can be performed in the etching equipment 200 to remove the organic pollutions on the semiconductor substrate 52. Next, a surface treatment is optionally performed on the transitional silicide 70. Subsequently, an HPM stripping process 76 can also performed in the etching equipment 200. Hydrogen peroxide, chlorine, and hydrochloric acid of the HPM etching solution will react with the un-reacted remnant platinum on the transitional silicide 70 to form soluble complex ions, and the un-reacted platinum on the transitional silicide 70 is therefore stripped.

After the un-reacted platinum on the transitional silicide 70 is removed, a second RTP is performed on the semiconductor wafer 50 so as to complete the salicide process. In the second RTP, the transitional silicide 70 reacts with parts of the semiconductor substrate 52 to form a more stable silicide (not shown in the figure) that has lower resistance. In this embodiment, the silicide is nickel silicide (NiSi). Of course, the silicide could be cobalt silicide or titanium silicide in other embodiments. Furthermore, a contact etch stop layer (CESL) of the strained-silicon transistors can be formed optionally, or an interlayer dielectric (ILD) can be formed by a chemical vapor deposition (CVD) process on the whole semiconductor substrate 52 and the gate structure 60. The needed contact plugs are made sequentially to complete the electrical connection of the semiconductor wafer 50.

Since the semiconductor substrate 52 is etched by the etching solution 320 sprayed from both the center region and the side region of the rotating platform 210, the etching uniformity of the semiconductor substrate 52 is improved. The above-mentioned embodiment is an example of the present invention applied in the SPM etching process, however, a person skilled in this art should know that the present invention can be applied to the above-mentioned APM etching process, HPM etching process or an etching process of removing photoresist. In addition, the present invention can be further applied to etching processes of removing platinum, palladium, manganese, tantalum, titanium, cobalt silicon, tantalum nitride, oxide, or nickel silicon.

Figure 9:
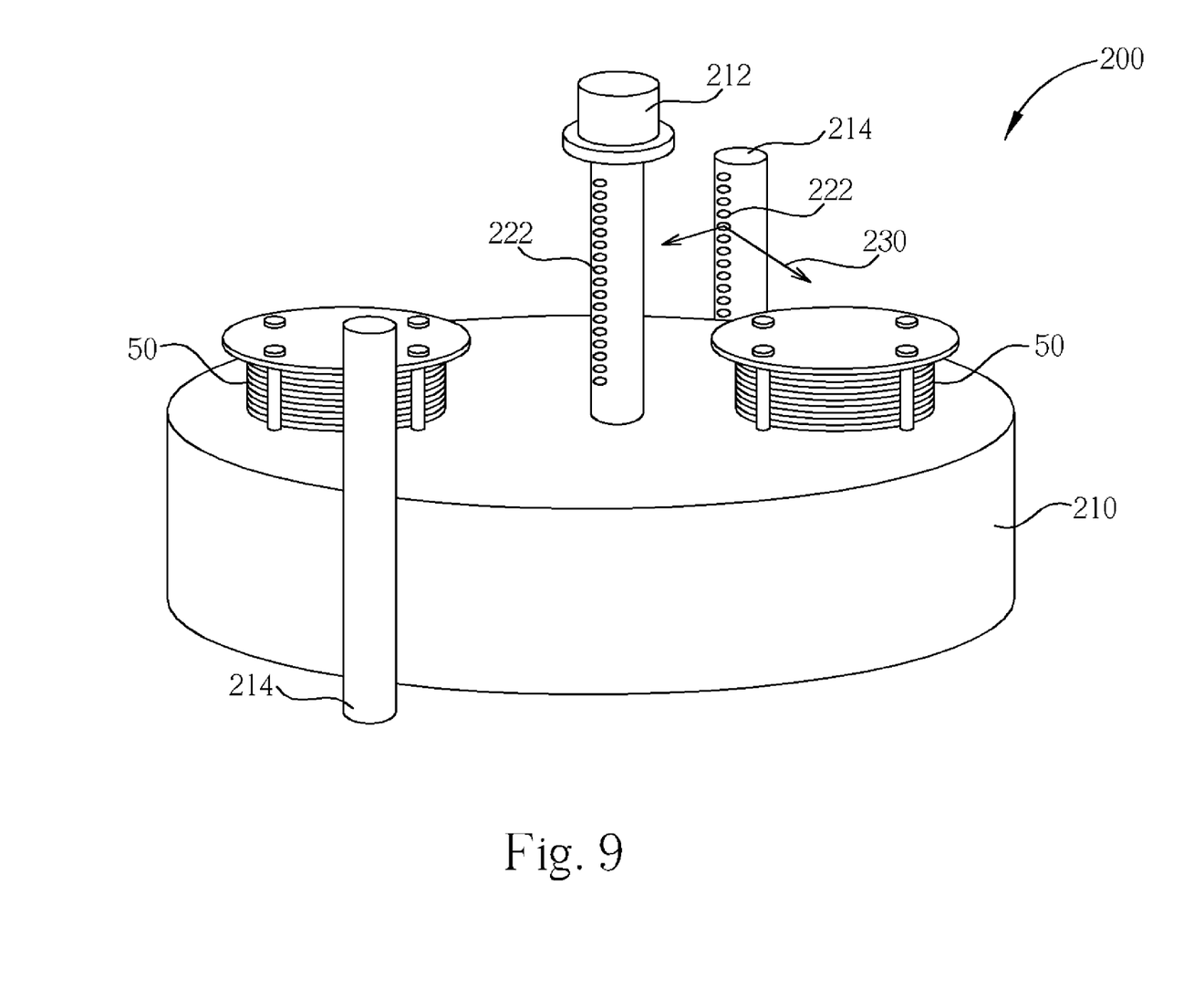
FIG. 9 is a schematic diagram illustrating a method of removing a material layer according to a second preferred embodiment of the present invention.

Please refer to FIG. 9. FIG. 9 is a schematic diagram illustrating a method of removing a material layer according to a second preferred embodiment of the present invention, wherein the same numerals designate similar or the same elements. As shown in FIG. 9, the etching equipment 200 includes a rotating platform 210, and the semiconductor wafer 50 is fixed on the rotating platform 210. A center pipe 212 positioned on the center region of the rotating platform 210 and two side pipes 214 positioned on the side region of the rotating platform 210 are included in the etching equipment 200. The two side pipes 214 can be located on two opposite sides of the side region. The side pipes 214 shown in these figures are all assembled on the etching equipment 200, and the side pipes 214 do not rotate with the rotating platform 210. In other embodiments, the side pipes 214 can be assembled on the rotating platform 210, and rotate with the rotating platform 210.

The center pipe 212 and the side pipes 214 have a plurality of nozzles 222 respectively, and the etching solution 230 of the etching process is sprayed from the nozzles 222. The nozzles 222 of the center pipe 212 can be distributed around the sidewall of the center pipe 212, and disperse uniformly from the top to the bottom of the center pipe 212. The nozzles 222 of the side pipes 214 can be distributed uniformly around the sidewalls of the side pipes 214 from the top to the bottom. In other embodiment, the nozzles 222 of the side pipes 214 can be distributed only on one side of the side pipes 214, which is toward the center region, and disperse uniformly from the top to the bottom.

Referring to each of the nozzles 222, the etching solution 230 is sprayed along a horizontal direction, and the spraying range is about 120°, forming a fan-shaped liquid film. As known by those skilled in this art, the spraying direction and the spraying range are both the processing factors, which can be adjusted. For example, the nozzles 222 can spray the etching solution 230 along a direction slanting to the top or a direction slanting to the bottom.

In the above-mentioned embodiments, an operating time percentage of the first spraying period and an operating time percentage of the second spraying period are 50% and 50% respectively. In a third preferred embodiment of the present invention, an operating time percentage of the first spraying period and an operating time percentage of the second spraying period are 60% and 40% respectively. In a fourth preferred embodiment of the present invention, an operating time percentage of the first spraying period and an operating time percentage of the second spraying period are 70% and 30% respectively. In a fifth preferred embodiment of the present invention, the etching solution 230 is sprayed from the side pipe 214 and from the center pipe 212 alternately and circularly until the material layer is stripped. In addition, in a sixth preferred embodiment of the present invention, the etching solution 230 is sprayed from both the center pipe 212 and the side pipe 214 toward the semiconductor wafer 50 simultaneously until the material layer is stripped so that more time is saved.

Furthermore, in the meantime, the rotating mode of the rotating platform 210 is not limited to a clockwise-counterclockwise-clockwise-counterclockwise direction, and can be only a clockwise direction or only a counterclockwise direction. According to the experience data, when the rotating mode of the rotating platform 210 includes both the clockwise spin and the counterclockwise spin, the etching uniformity of the semiconductor substrate 52 is more improved. In other embodiments of the present invention, the rotating platform 210 can rotate circularly. In other words, the rotating platform 210 can rotate along a clockwise direction and a counterclockwise direction alternately until the material layer is stripped.

Figure 10:
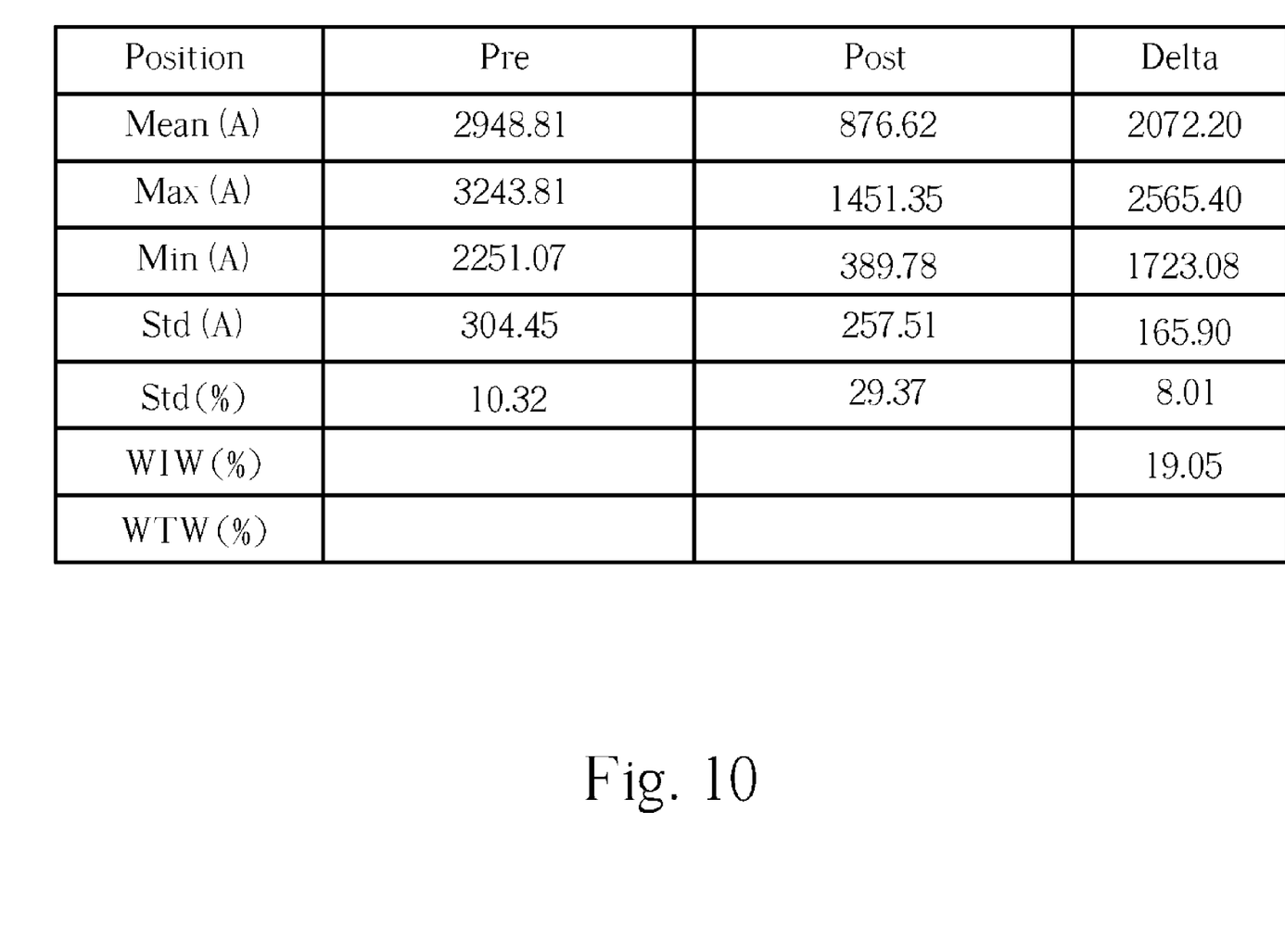
FIG. 10 is a schematic diagram illustrating a table of the SPM etching data according to the first preferred embodiment of the present invention.

Please refer to FIG. 10. FIG. 10 is a schematic diagram illustrating a table of the SPM etching data according to the first preferred embodiment of the present invention, where the data of thickness are measured from many different positions of the semiconductor substrate 52 by a probe of a measuring device. As shown in FIG. 10, before performing the SPM etching process, the average thickness of the semiconductor substrate 52 (or called the mean thickness) is about 2948.81 angstroms, the thickest thickness of the semiconductor substrate 52 (or called the maximum thickness) among these measured positions is about 3243.81 angstroms, the thinnest thickness of the semiconductor substrate 52 (or called the minimum thickness) is about 2251.07 angstroms, and the standard deviation (shown as Std) of the semiconductor substrate 52 among these measured positions is 10.32%. After performing the SPM etching process, the mean thickness of the semiconductor substrate 52 decreases to 876.62 angstroms around, and the standard deviation of the thickness only increases to 29.37%. Accordingly, the difference between the standard deviation measured before the SPM etching process and the standard deviation measured after the SPM etching process is 19.05%. The difference between the standard deviation measured before the SPM etching process and the standard deviation measured after the SPM etching process is marked "WIW" (within wafer).

Figure 11:
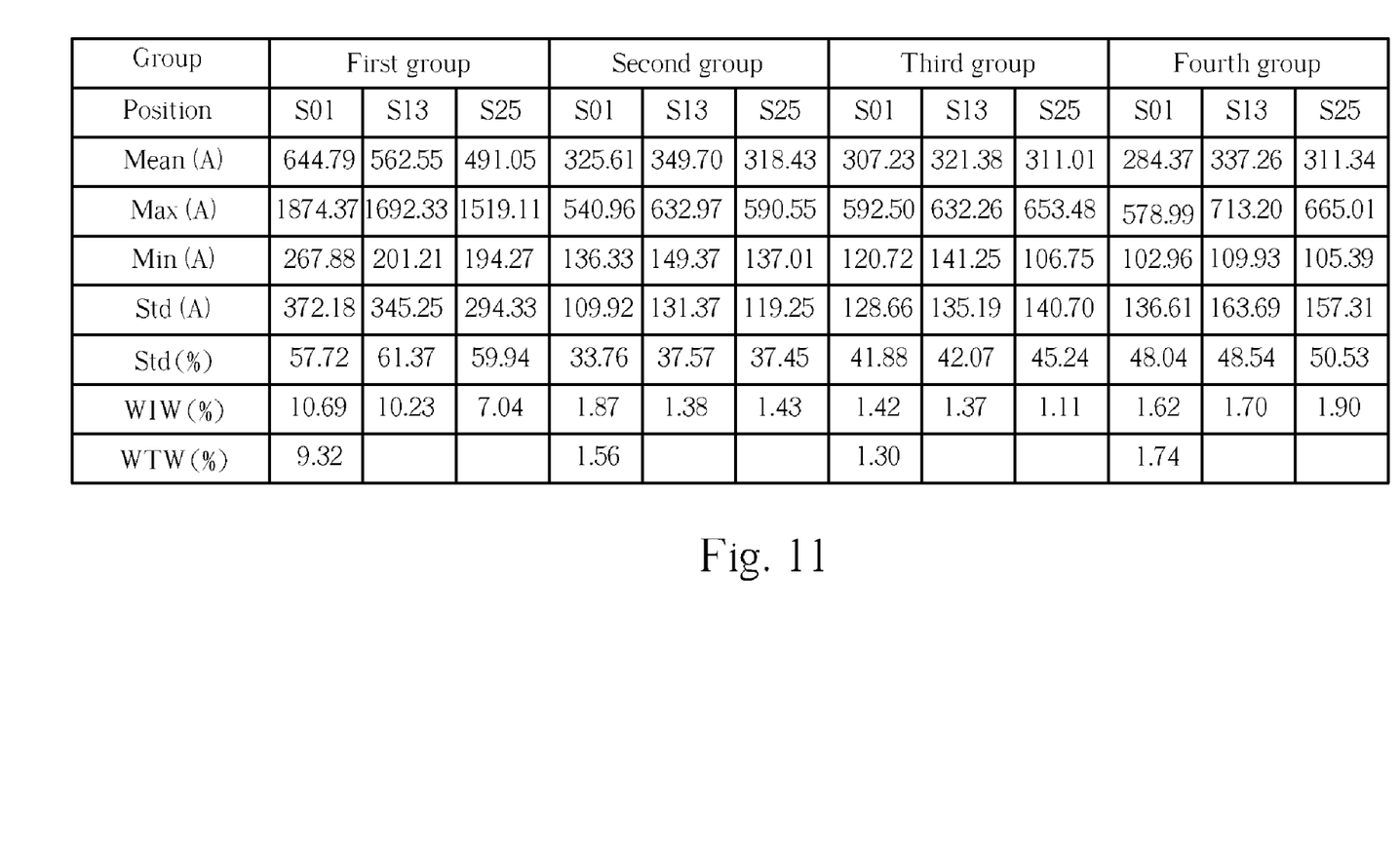
FIG. 11 is a schematic diagram illustrating another table of the etching data according to the present invention and the prior art.

Please refer to FIG. 11. FIG. 11 is a schematic diagram illustrating another table of the etching data according to the present invention and the prior art. The semiconductor substrates in the first group undergo the prior art method to remove the material layers on their surfaces. In other words, the etching solution is sprayed from only the center pipe toward the semiconductor substrates in the first group, and these semiconductor substrates are not etched by an etching solution sprayed from the side pipe. The semiconductor substrates in the second group undergo the method of the first preferred embodiment in the present invention to remove the material layers. That is to say, the operating time percentages of the first spraying period and of the second spraying period are 50% and 50% respectively. The semiconductor substrates in the third group undergo the method of the second preferred embodiment in the present invention to remove the material layers. In other words, the operating time percentages of the first spraying period and of the second spraying period are 60% and 40% respectively. The semiconductor substrates in the fourth group undergo the method of the third preferred embodiment in the present invention to remove the material layers. In other words, the operating time percentages of the first spraying period and of the second spraying period are 70% and 30% respectively. The etching times of these etching processes in FIG. 11 are all determined to be one minute, and the rotating platform rotates along the clockwise direction in these etching processes. The measuring data of three semiconductor substrates are shown in each group, and the three semiconductor substrates are marked "S01", "S13" and "S25" respectively. It should be noticed that all the etching processes adopt the same SPM etching solution having the same component ratio in the FIG. 11, but the component ratio of the etching solution adopted by the etching process in FIG. 10 is not identical with the one in FIG. 11. However, as known by those skilled in this art, various etching solutions can be adopted in the present invention, and there is no need to discuss the component ratio of various etching solutions in detail.

As shown in FIG. 11, according to the data of the semiconductor substrate S01 in the first group, the mean thickness of the semiconductor substrate S01 after the etching process is about 644.79 angstroms, the maximum thickness is about 1874.37 angstroms, the minimum thickness is about 267.88 angstroms, and the standard deviation is around 57.72%. The difference between the standard deviation measured before the SPM etching process and the standard deviation measured after the SPM etching process (called WIW value) is 10.69% for the semiconductor substrate S01. According to the data of the first group, the WIW values of the semiconductor substrates S01, S13 and S25 are 10.69%, 10.23% and 7.04% respectively. Accordingly, the average WIW value of the semiconductor substrates S01, S13 and S25 in the first group is 9.32%. The average WIW value of the semiconductor substrates S01, S13 and S25 is marked "WTW" (wafer to wafer). On other hand, the WTW values of the second, the third and the fourth groups, which adopt the present invention, are 1.56%, 1.30% and 1.74% respectively. In comparison among the data of these groups, it is recognized that the etching uniformities of the semiconductor substrates are greatly improved by the present invention. Especially, when the operating time percentages of the first spraying period and of the second spraying period are 50% and 50% respectively, the WIW values of the semiconductor substrates S01, S13 and S25 are 33.76%, 37.57% and 37.45% respectively. These values evidence that the semiconductor substrates S01, S13 and S25 have excellent etching uniformities. In addition, under the same etching time, the thicknesses of the semiconductor substrates in the present invention are thinner than the thicknesses of the semiconductor substrates in the prior art. As a result, in order to receive the same thickness, the needed etching time of the present invention is shorter than the needed etching time of the prior art.

In summery, the etching uniformity of the semiconductor substrate is greatly improved by the present invention, and the needed etching time for removing the material layer is shortened. As a result, the yield of the products is increased, and the cost of operating the processes is decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of removing material layer, comprising:
providing a semiconductor substrate fixed on a rotating platform, the semiconductor substrate including a material layer on a surface of the semiconductor substrate; and
performing an etching process, the etching process rotating the rotating platform, and spraying an etching solution from a center region and a side region of the rotating platform toward the semiconductor substrate until the material layer is removed, wherein the etching solution is sprayed from a center pipe and a side pipe of the rotating platform, the center pipe comprises a plurality of nozzles disposed in at least a vertical row, and the side pipe comprises a plurality of nozzles disposed in at least a vertical row, and the etching solution is sprayed from the nozzles;
wherein the semiconductor substrate is disposed between the center region and the side region of the rotating platform.

2. The method of claim 1, wherein the etching solution is sprayed from both the center region and the side region of the rotating platform toward the semiconductor substrate simultaneously.

3. The method of claim 1, wherein the etching process comprises a first spraying period and a second spraying period, the etching solution is sprayed from the side region of the rotating platform in the first spraying period, and the etching solution is sprayed from the center region of the rotating platform in the second spraying period.

4. The method of claim 3, wherein an operating time percentage of the first spraying period and an operating time percentage of the second spraying period are 50% and 50% respectively.

5. The method of claim 1, wherein the center pipe is positioned in the center region of the rotating platform.

6. The method of claim 1, wherein the side pipe is positioned in the side region of the rotating platform.

7. The method of claim 1, wherein the etching solution is sprayed along a horizontal direction, and a spraying range is 120 degrees)(120°).

8. The method of claim 1, wherein the material layer comprises platinum, cobalt silicon, titanium nitride, oxide, nickel silicon, tantalum, photoresist, or their mixture.

9. The method of claim 1, wherein a rotating mode of the rotating platform includes a clockwise spin and a counterclockwise spin.

10. The method of claim 1, wherein the rotating platform is rotated along a clockwise direction, a counterclockwise direction, the clockwise direction, and the counterclockwise direction in turn.

11. The method of claim 1, further comprising providing a plurality of semiconductor substrates fixed on the rotating platform, where the semiconductor substrates do not overlap with each other.

12. A method of removing remnant metal, comprising:
providing a semiconductor substrate fixed on a rotating platform, the semiconductor substrate including a metal silicide and a remnant metal; and performing an etching process, the etching process rotating the rotating platform, and spraying an etching solution from a center region and a side region of the rotating platform toward the semiconductor substrate until the remnant metal is removed and the metal silicide remains, wherein the etching solution is sprayed from a center pipe and a side pipe of the rotating platform, the center pipe comprises a plurality of nozzles disposed in at least a vertical row and the side pipe comprises a plurality of nozzles disposed in at least a vertical row, and the etching solution is sprayed from the nozzles;

wherein the semiconductor substrate is disposed between the center region and the side region of the rotating platform.

13. The method of claim 12, wherein the etching process etches the remnant metal by utilizing sulfuric acid-hydrogen peroxide mixture (SPM), ammonium hydrogen peroxide mixture (APM), hydrochloric acid hydrogen peroxide mixture (HPM) or their composition.

14. The method of claim 12, wherein the remnant metal comprises platinum, palladium, manganese, tantalum, titanium or their mixture.

15. The method of claim 12, wherein the etching solution is sprayed from both the center region and the side region of the rotating platform toward the semiconductor substrate simultaneously.

16. The method of claim 12, wherein the etching process comprises a first spraying period and a second spraying period, the etching solution is sprayed from the side region of the rotating platform in the first spraying period, and the etching solution is sprayed from the center region of the rotating platform in the second spraying period.

17. The method of claim 16, wherein an operating time percentage of the first spraying period and an operating time percentage of the second spraying period are 50% and 50% respectively.

18. The method of claim 12, wherein a rotating mode of the rotating platform includes a clockwise spin and a counterclockwise spin.

19. The method of claim 12, wherein the rotating platform is rotated along a clockwise direction, a counterclockwise direction, the clockwise direction, and the counterclockwise direction in turn.

20. The method of claim 12, further comprising providing a plurality of semiconductor substrates fixed on the rotating platform, where the semiconductor substrates do not overlap with each other.

* * * * *